(12) United States Patent
Orlowski et al.

(10) Patent No.: US 10,905,007 B1
(45) Date of Patent: Jan. 26, 2021

(54) CONTACT PADS FOR ELECTRONIC SUBSTRATES AND RELATED METHODS

(71) Applicant: Qorvo US, Inc., Greensboro, NC (US)

(72) Inventors: John August Orlowski, Summerfield, NC (US); Thomas Scott Morris, Lewisville, NC (US); David Jandzinski, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/737,319

(22) Filed: Jan. 8, 2020

Related U.S. Application Data

(60) Provisional application No. 62/869,386, filed on Jul. 1, 2019.

(51) Int. Cl.
    *H05K 1/11*        (2006.01)
    *H05K 3/00*        (2006.01)
    *H05K 3/24*        (2006.01)

(52) U.S. Cl.
CPC ........... *H05K 1/113* (2013.01); *H05K 3/0041* (2013.01); *H05K 3/243* (2013.01); *H05K 2201/09736* (2013.01)

(58) Field of Classification Search
CPC ....................... H05K 1/113; H05K 2201/09736
See application file for complete search history.

(56) References Cited

U.S. PATENT DOCUMENTS

| | | | | |
|---|---|---|---|---|
| 2009/0242261 A1* | 10/2009 | Takenaka | ............... | H05K 3/045 174/262 |
| 2010/0002406 A1* | 1/2010 | Hsu | ......................... | H01L 24/19 361/764 |
| 2011/0005824 A1* | 1/2011 | An | ....................... | H05K 3/4658 174/261 |
| 2011/0088937 A1* | 4/2011 | Ko | ....................... | H05K 3/4602 174/261 |
| 2015/0279731 A1* | 10/2015 | Li | .......................... | H05K 3/107 257/753 |
| 2016/0105960 A1* | 4/2016 | Sakamoto | ............ | H05K 3/4694 361/720 |
| 2017/0018448 A1* | 1/2017 | Rusli | ................. | H01L 23/49838 |

\* cited by examiner

*Primary Examiner* — Hoa C Nguyen
(74) *Attorney, Agent, or Firm* — Withrow & Terranova, P.L.L.C.

(57) ABSTRACT

Electronic substrates, contact pads for electronic substrates, and related methods are disclosed. Electronic substrates may include an electrically conductive layer that forms at least one contact pad and at least one metal trace on a non-conductive layer. The contact pads are arranged with greater thicknesses or heights above the non-conductive layer than the metal traces. Dielectric layers are disclosed that cover the metal traces while leaving top surfaces of the contact pads exposed. Top surfaces of the dielectric layers may be arranged to be coplanar with top surfaces of the contact pads to provide electronic substrates having generally planar top faces. Bottom faces of electronic substrates may include mounting pads that are coplanar with additional dielectric layers. Methods are disclosed that include forming dielectric layers to cover contact pads and metal traces, and removing surface portions of the dielectric layers until the contact pads are accessible through the dielectric layers.

16 Claims, 7 Drawing Sheets

CONTACT PADS FOR ELECTRONIC SUBSTRATES AND RELATED METHODS

RELATED APPLICATIONS

This application claims the benefit of provisional patent application Ser. No. 62/869,386, filed Jul. 1, 2019, the disclosure of which is hereby incorporated herein by reference in its entirety.

FIELD OF THE DISCLOSURE

The present disclosure relates to electronic substrates, and particularly to contact pads for electronic substrates and related methods.

BACKGROUND

Electronic substrates are often used to support and connect electrical components and electronic modules. Laminate structures, including printed circuit boards (PCBs) and the like, are commonly used as electronic substrates for electronic devices. A typical laminate structure may include a non-conductive body for support and one or more conductive features for connecting semiconductor die, electrical components, and electronic modules. Some of the conductive features can be exposed at a surface of the non-conductive body and may include contact pads, conductive traces, surface-exposed sections of vias, and the like. Electrical components are mounted to the exposed conductive features to form electronic devices, modules, and circuits.

PCBs are electronic substrates that are often used to mount electrical components housed within integrated circuit (IC) packages. For example, a semiconductor die is often mounted on a PCB and then covered with an overmold in order to protect the semiconductor die. Traditional PCBs are often formed from a laminate structure of non-conductive and conductive layers. The conductive layers can form a conductive structure of the PCB that is arranged to connect input and output structures of the semiconductor die to other electrical components within the IC package and/or to input and output structures of the IC package accessible externally from the IC package. The conductive structure typically has conductive layers formed horizontally between the non-conductive layers and/or on a substrate surface. These conductive layers are shaped to form various structures, such as traces, terminals, contact pads, and the like to connect electrical components within the IC package and/or the input and output structures of the IC package to the electrical components.

The art continues to seek improved electronic devices and related fabrication techniques capable of overcoming challenges associated with conventional electronic devices.

SUMMARY

The present disclosure relates to electronic substrates, and particularly to contact pads for electronic substrates and related methods. Electronic substrates may include an electrically conductive layer that forms at least one contact pad and at least one metal trace on a non-conductive layer. The contact pads are arranged with greater thicknesses or heights above the non-conductive layer than the metal traces. Dielectric layers are disclosed that cover the metal traces while leaving top surfaces of the contact pads exposed. Top surfaces of the dielectric layers may be arranged to be coplanar with the top surfaces of the contact pads to provide electronic substrates having generally planar top faces. Bottom faces of electronic substrates may include mounting pads that are coplanar with additional dielectric layers. Methods are disclosed that include forming dielectric layers to cover contact pads and metal traces, and removing surface portions of the dielectric layers until the contact pads are accessible through the dielectric layers.

In one aspect, an electronic substrate comprises: a non-conductive layer; a conductive layer on the non-conductive layer, the conductive layer forming at least one contact pad and at least one metal trace; and a dielectric layer on the conductive layer such that the at least one metal trace is covered by the dielectric layer and a top surface of the at least one contact pad is coplanar with a top surface of the dielectric layer. In certain embodiments, the conductive layer comprises copper. In certain embodiments, the dielectric layer comprises prepreg or a resin coated film. In certain embodiments, the dielectric layer is devoid of acrylic-based materials. In certain embodiments, a thickness of the at least one contact pad above the non-conductive layer is in a range including 3 microns (μm) to 12 μm greater than a thickness of the at least one metal trace above the non-conductive layer. In certain embodiments, at least a portion of the at least one metal trace is completely embedded in the dielectric layer. In certain embodiments, the non-conductive layer and the conductive layer form a laminate structure with a plurality of additional non-conductive layers and a plurality of additional conductive layers.

In certain embodiments, the electronic substrate further comprises an additional conductive layer that forms at least one mounting pad on a bottom face of the electronic substrate. In certain embodiments, the electronic substrate further comprises an additional dielectric layer wherein a bottom surface of the at least one mounting pad is coplanar with a bottom surface of the additional dielectric layer. In certain embodiments, the electronic substrate further comprises a surface finish coating on the at least one contact pad and the at least one mounting pad. In certain embodiments, the at least one mounting pad comprises a portion that is covered by the additional dielectric layer.

In another aspect, an electronic substrate comprises: a non-conductive layer; a conductive layer on the non-conductive layer, the conductive layer forming at least one contact pad and at least one metal trace, wherein a thickness of the at least one contact pad is greater than a thickness of the at least one metal trace above the non-conductive layer; and a dielectric layer on the conductive layer such that the at least one metal trace is covered by the dielectric layer and a top surface of the at least one contact pad is uncovered by the dielectric layer. In certain embodiments, the thickness of the at least one contact pad is in a range including 3 μm to 12 μm greater than a thickness of the at least one metal trace above the non-conductive layer. In certain embodiments, at least a portion of the at least one metal trace is completely embedded in the dielectric layer. In certain embodiments, the thickness of the at least one contact pad is within one percent of a thickness of the dielectric layer above the non-conductive layer. In certain embodiments, the at least one contact pad and the at least one metal trace comprise the same material.

In another aspect, a method of fabricating an electronic substrate comprises: depositing a conductive layer on a non-conductive layer such that the conductive layer forms at least one metal trace and partially forms at least one contact pad; selectively depositing additional conductive material to form the at least one contact pad with a greater thickness than the at least one metal trace; forming a dielectric layer on the conductive layer such that the at least one metal trace and the at least one contact pad are covered by the dielectric layer; and removing surface portions of the dielectric layer to expose a top surface of the at least one contact pad while still covering the at least one metal trace. In certain embodiments, the additional conductive material comprises a same material as the conductive layer. In certain embodiments, the method further comprises forming a mask material over the at least one metal trace before selectively depositing the additional conductive material. In certain embodiments, the method further comprises removing the mask material before forming the dielectric layer. In certain embodiments, a top surface of the at least one contact pad is coplanar with a top surface of the dielectric layer. In certain embodiments, removing the surface portions of the dielectric layer comprises planarizing a top surface of the dielectric layer. In certain embodiments, removing the surface portions of the dielectric layer comprises mechanical grinding. In certain embodiments, removing the surface portions of the dielectric layer comprises plasma etching. In certain embodiments, the method further comprises applying a surface finish to the top surface of the at least one contact pad.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
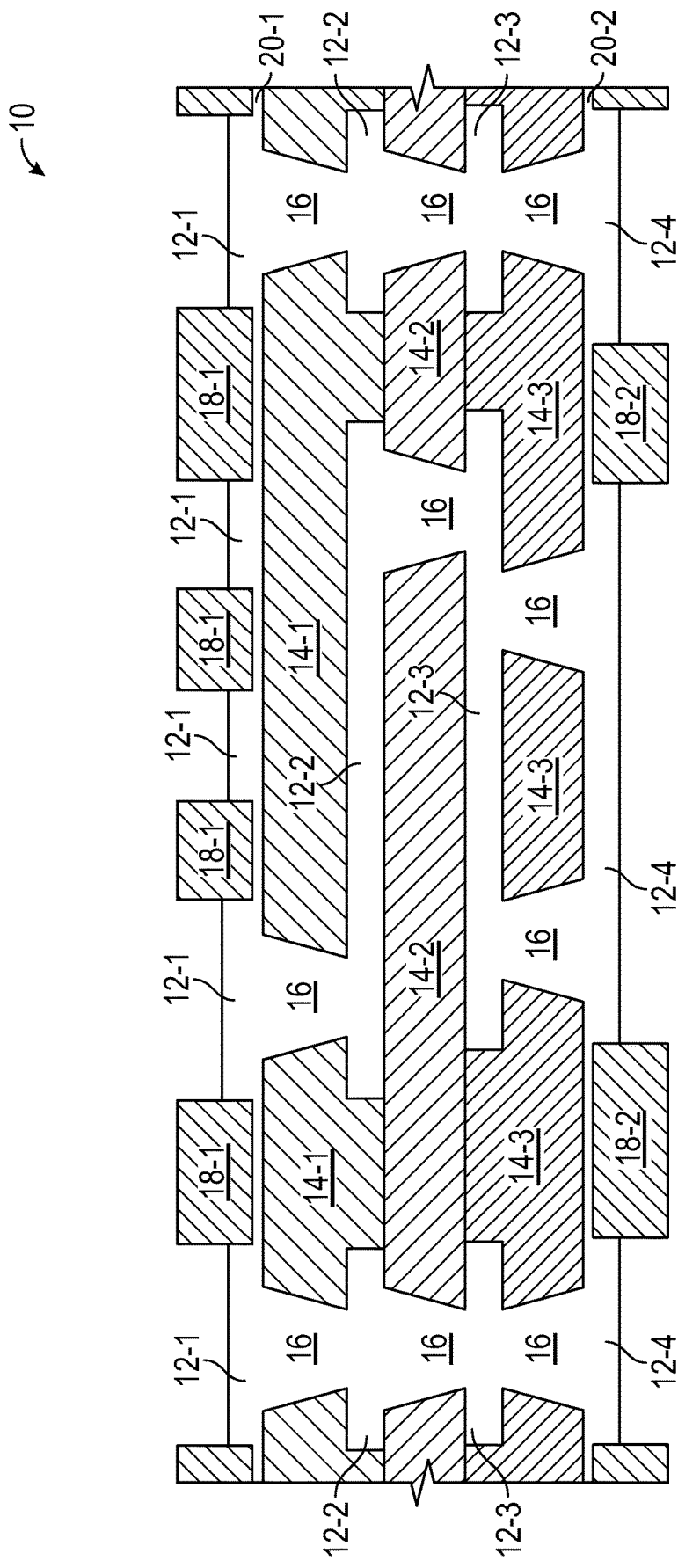
FIG. 1 is a cross-sectional view of a substrate for electronic devices in a partially assembled state.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Common elements between figures may be shown herein with common element numbers and may not be subsequently re-described.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Electronic substrates as disclosed herein may be useful to support and connect various electrical components for electrical devices. Electrical components may include various combinations of resistors, capacitors, inductors, resonators, bond wires, and integrated circuits (ICs) that may form one or more electronic devices, modules, and circuits. In certain embodiments, the electrical components may include an electronic circuit built on its own semiconductor substrate, such as a processor, volatile memory, non-volatile memory, a radio frequency (RF) circuit, or a micro-electromechanical system (MEMS) device. In certain embodiments, the electrical components may include one or more electrical devices such as filters, capacitors, inductors, resistors, amplifiers, low-noise amplifiers (LNA), switching devices, transmit/receive modules, or electronic circuits having combinations thereof. In this regard, electronic substrates as described herein may be suited for use as device substrates for cellular applications, among others.

Substrates, such as printed circuit boards (PCBs), typically include metal traces and electrical contact pads arranged to provide electrical connections and mounting surfaces for electrical components. Solder mask, solder resist, and/or oxide coatings are typically applied over metal traces for environmental protection and to prevent unintended electrical connections during soldering of electrical components. In a typically process, solder mask material is applied over a PCB, and various openings are formed in portions of the solder mask to expose contact pads of the PCB for soldering. In this regard, solder mask material is formed with a greater height from the PCB than metal traces and contact pads. Electrical components may then be mounted through the solder mask openings to the exposed contact pads.

The present disclosure relates to electronic substrates, and particularly to contact pads for electronic substrates and related methods. Electronic substrates may include an electrically conductive layer that forms at least one contact pad and at least one metal trace on a non-conductive layer. The contact pads are arranged with greater thicknesses or heights above the non-conductive layer than the metal traces. Dielectric layers are disclosed that cover the metal traces while leaving top surfaces of the contact pads exposed. Top surfaces of the dielectric layers may be arranged to be coplanar with the top surfaces of the contact pads to provide electronic substrates having generally planar top faces. Bottom faces of electronic substrates may include mounting pads that are coplanar with additional dielectric layers. Methods are disclosed that include forming dielectric layers to cover contact pads and metal traces, and removing surface portions of the dielectric layers until the contact pads are accessible through the dielectric layers FIG. 1 is a cross-sectional view of a substrate 10 for electronic devices in a partially assembled state. The substrate 10 includes a plurality of conductive layers 12-1 to 12-4 and a plurality of non-conductive layers 14-1 to 14-3. One or more vias 16 that are electrically conductive may also be arranged to provide electrical connections between different ones of the conductive layers 12-1 to 12-4. The substrate 10 may form a PCB or a laminate structure where the plurality of conductive layers 12-1 to 12-4 are laminated in an alternating manner with the plurality of non-conductive layers 14-1 to 14-3. While four conductive layers 12-1 to 12-4 are illustrated, the substrate 10 may be configured with any number of conductive layers. Generally, increasing the number of laminated conductive layers corresponds to an increased number of electronic devices that may be mounted and electrically connected on the substrate 10. This allows electrical connections to various electrical components to be made at different horizontal planes within the substrate 10. In the illustration of FIG. 1, the non-conductive layer 14-2 is configured as a core layer of the substrate 10. In certain embodiments, the plurality of conductive layers 12-1 to 12-4 may include a metal such as copper (Cu), electrolytic Cu, copper foil, or the like. In this regard, the plurality of conductive layers 12-1 to 12-4 may form electrically and thermally conductive layers. In certain embodiments, the plurality of non-conductive layers 14-1 to 14-3 may include fiber materials, glass, epoxy, glass-reinforced epoxy, prepreg, ceramic materials, polymer materials, dielectric materials, and combinations thereof. In this regard, the plurality of non-conductive layers 14-1 to 14-3 may form layers that are electrically insulating. The non-conductive layer 14-2, serving as the core layer, may include a same material or different material than the other non-conductive layers 14-1, 14-3. One or more of the conductive layers 12-1 to 12-4 may comprise a pattern of continuous portions and discontinuous portions along the substrate 10. Discontinuous portions of the same conductive layer may be electrically connected or isolated from one another depending on the configuration.

In order to form discontinuous portions of one or more of the conductive layers 12-1 to 12-4, patterned resist layers may be used. In FIG. 1, primary resist layers 18-1, 18-2 are arranged on opposing major faces of the substrate 10. In this example, the opposing major faces are top and bottom faces of the substrate where a first primary resist layer 18-1 is patterned at the top face and a second primary resist layer 18-2 is patterned at the bottom face. When the substrate 10 is fully assembled as illustrated in the subsequent figures, the top face of the substrate 10 is where one or more electronic devices may be mounted, and the bottom face of the substrate 10 is configured for mounting the substrate 10 to another surface. The primary resist layers 18-1, 18-2 may be patterned by various methods, including lithography and photolithography. A first conductive layer 12-1 may then be deposited through the first primary resist layer 18-1 and a fourth conductive layer 12-4 may be deposited through the second primary resist layer 18-2. In certain embodiments, a first seed layer 20-1 of thin conductive material (e.g., a thin Cu layer) may initially be provided between the first primary resist layer 18-1 and a first non-conductive layer 14-1 to facilitate deposition of the first conductive layer 12-1. In a similar manner, a second seed layer 20-2 may be provided between a third non-conductive layer 14-3 and the second primary resist layer 18-2 to facilitate deposition of the fourth conductive layer 12-4.

Figure 2:
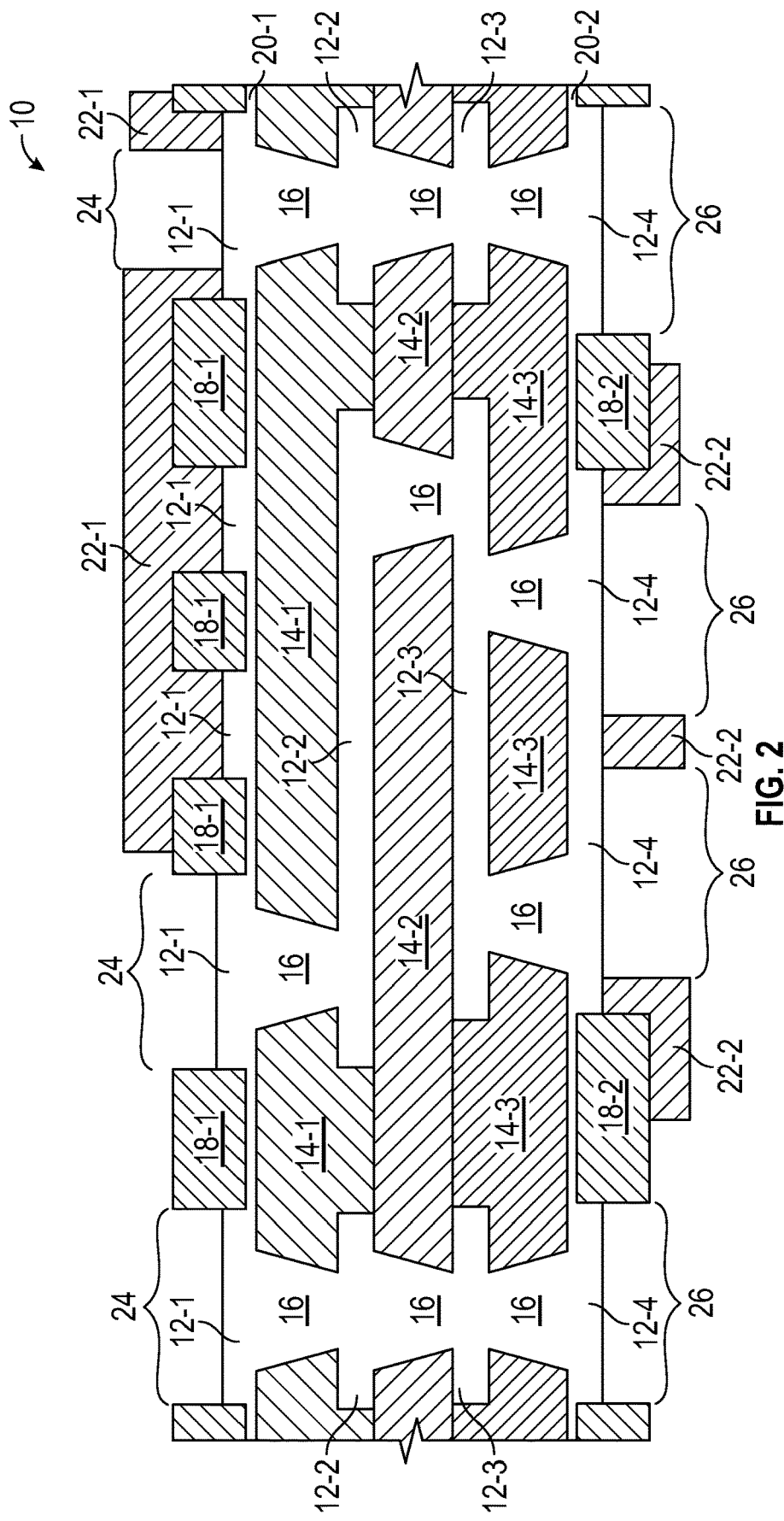
FIG. 2 is a cross-sectional view of the substrate of FIG. 1 with the addition of secondary resist layers over primary resist layers.

FIG. 2 is a cross-sectional view of the substrate 10 of FIG. 1 with the addition of secondary resist layers 22-1, 22-2. A first secondary resist layer 22-1 is provided over portions of the first primary resist layer 18-1 and over portions of the first conductive layer 12-1. In this regard, portions of the first primary resist layer 18-1 and the first conductive layer 12-1 that are uncovered by the first secondary resist layer 22-1 form openings 24 that allow heights or thicknesses of the first conductive layer 12-1 to be selectively increased within such openings 24. In a similar manner, a second secondary resist layer 22-2 is provided over portions of the second primary resist layer 18-2 and over portions of the fourth conductive layer 12-4. In this regard, portions of the second primary resist layer 18-2 and the fourth conductive layer 12-4 that are uncovered by the second secondary resist layer 22-2 form openings 26 that allow heights or thicknesses of the fourth conductive layer 12-4 to be selectively increased within such openings 26.

Figure 3:
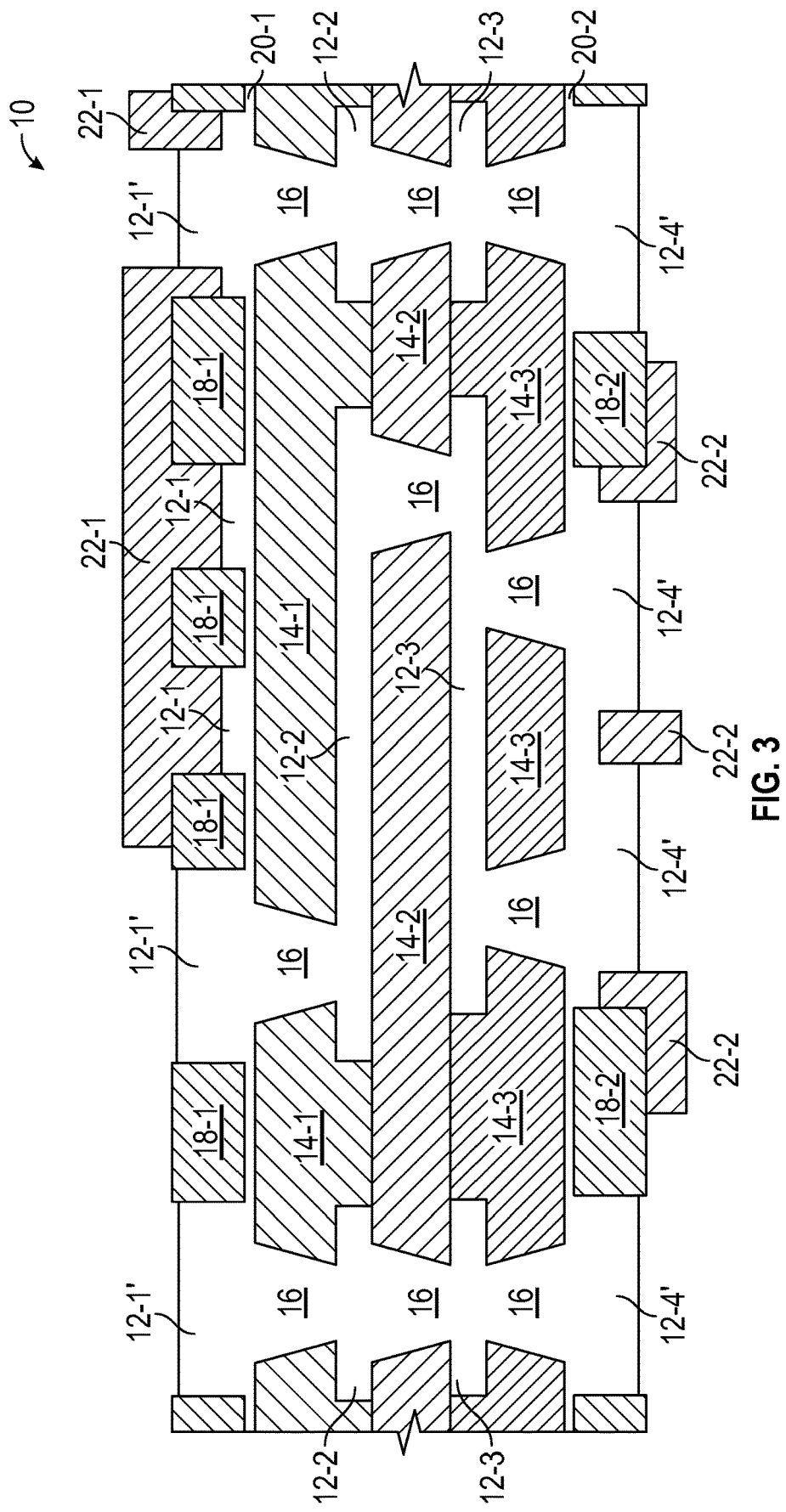
FIG. 3 is a cross-sectional view of the substrate of FIG. 2 illustrating increased thickness portions of conductive layers that are selectively increased through openings illustrated in FIG. 2.

FIG. 3 is a cross-sectional view of the substrate 10 of FIG. 2 illustrating increased thickness portions 12-1', 12-4' of the first conductive layer 12-1 and the fourth conductive layer 12-4 that are selectively increased through the openings 24, 26 of FIG. 2. In this regard, additional conductive materials may be formed through the openings 24, 26 and onto portions of the respective conductive layers 12-1, 12-4. In certain embodiments, the additional conductive materials may comprise the same material (e.g., electrolytic Cu) as the portions of the conductive layers 12-1, 12-4 as previously deposited. In other embodiments, the additional conductive material may comprise one or more different materials. The additional conductive materials may be formed through the opening 24, 26 by any number of processes, including thin film deposition, sputtering, evaporation, and plating.

Figure 4:
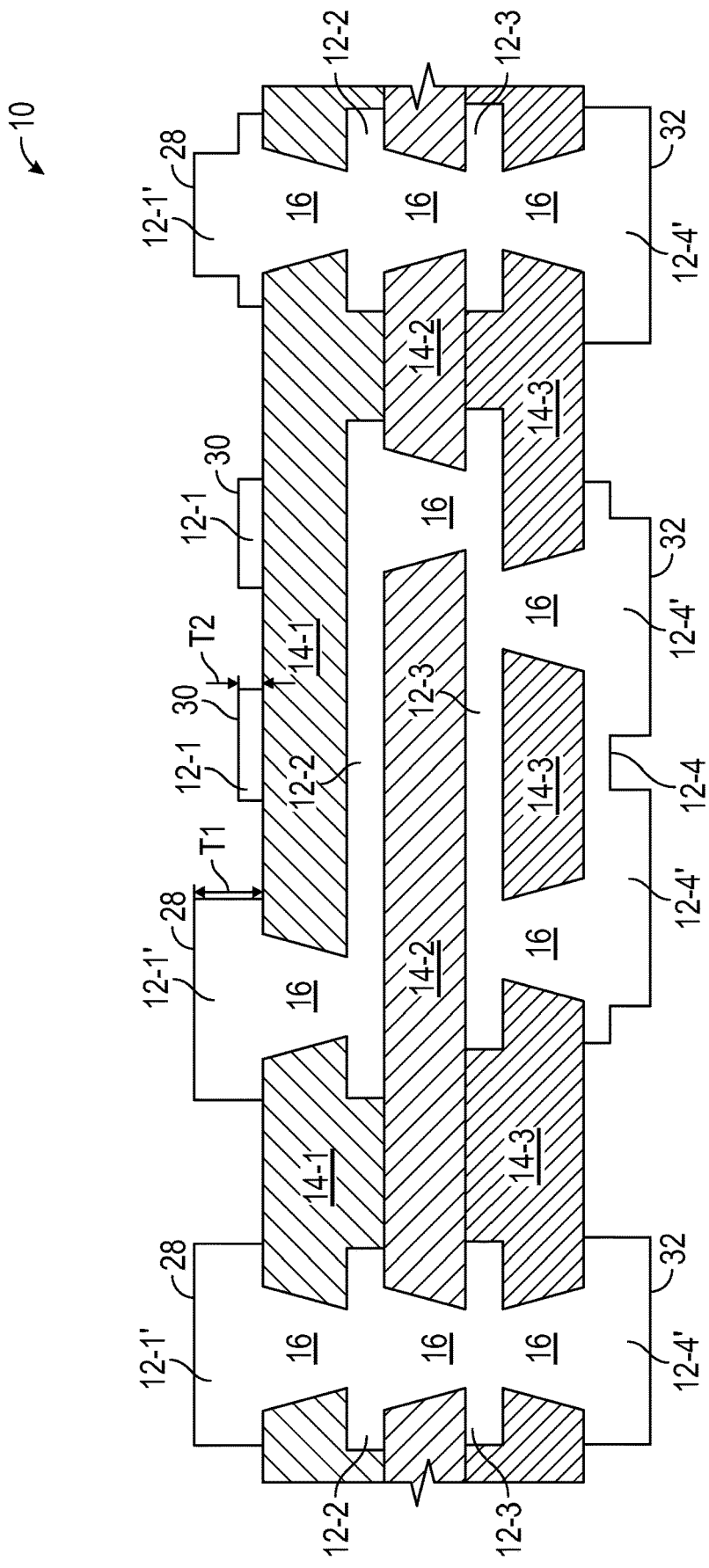
FIG. 4 is a cross-sectional view of the substrate of FIG. 3 after removal of the primary resist layers, the secondary resist layers, and uncovered portions of seed layers of FIG. 3 to form contact pads and metal traces having differing heights.

FIG. 4 is a cross-sectional view of the substrate 10 of FIG. 3 after removal of the primary resist layers 18-1, 18-2, the secondary resist layers 22-1, 22-2 and any uncovered portions of the seed layers 20-1, 20-2 of FIG. 3. Removal of such layers may comprise one or more of stripping and etching steps. The increased thickness portions 12-1' of the first conductive layer 12-1 are configured as one or more contact pads 28, and portions of the first conductive layer 12-1 that were covered by the secondary resist layer 22-1 are configured as one or more metal traces 30. As such, the one or more contact pads 28 are configured with a thickness T1 that is greater than a thickness T2 of the one or more metal traces 30 as measured above the non-conductive layer 14-1. In certain embodiments, the thickness T1 is in a range including 3 microns (µm) to 12 µm greater than the thickness T2, or in a range including 5 µm to 10 µm. In certain embodiments, the thickness T1 is in a range including 10 µm to 50 µm above the non-conductive layer 14-1. In a similar manner, the increased thickness portions 12-4' of the fourth conductive layer 12-4 that are located on the bottom face of the substrate 10 may be configured to form one or more surfaces for mounting the substrate 10 to another surface. In certain embodiments, the increased thickness portions 12-4' of the fourth conductive layer 12-4 form one or more mounting pads 32 such as a grid array, including a land grid array (LGA) for mounting the substrate 10 to another surface. As illustrated in FIG. 4, one or more of the increased thickness portions 12-4' of the fourth conductive layer 12-4 may be continuous with one or more other portions of the fourth conductive layer 12-4 that do not have increased thickness. In this manner, different ones of the increased thickness portions 12-4' may be electrically coupled to form a larger ground plane for the substrate 10 and/or thermally coupled to form a larger heat sink in certain embodiments.

With such dimensions, the substrate 10 may be well suited for low profile applications, such as a PCB for mobile phone applications.

Figure 5:
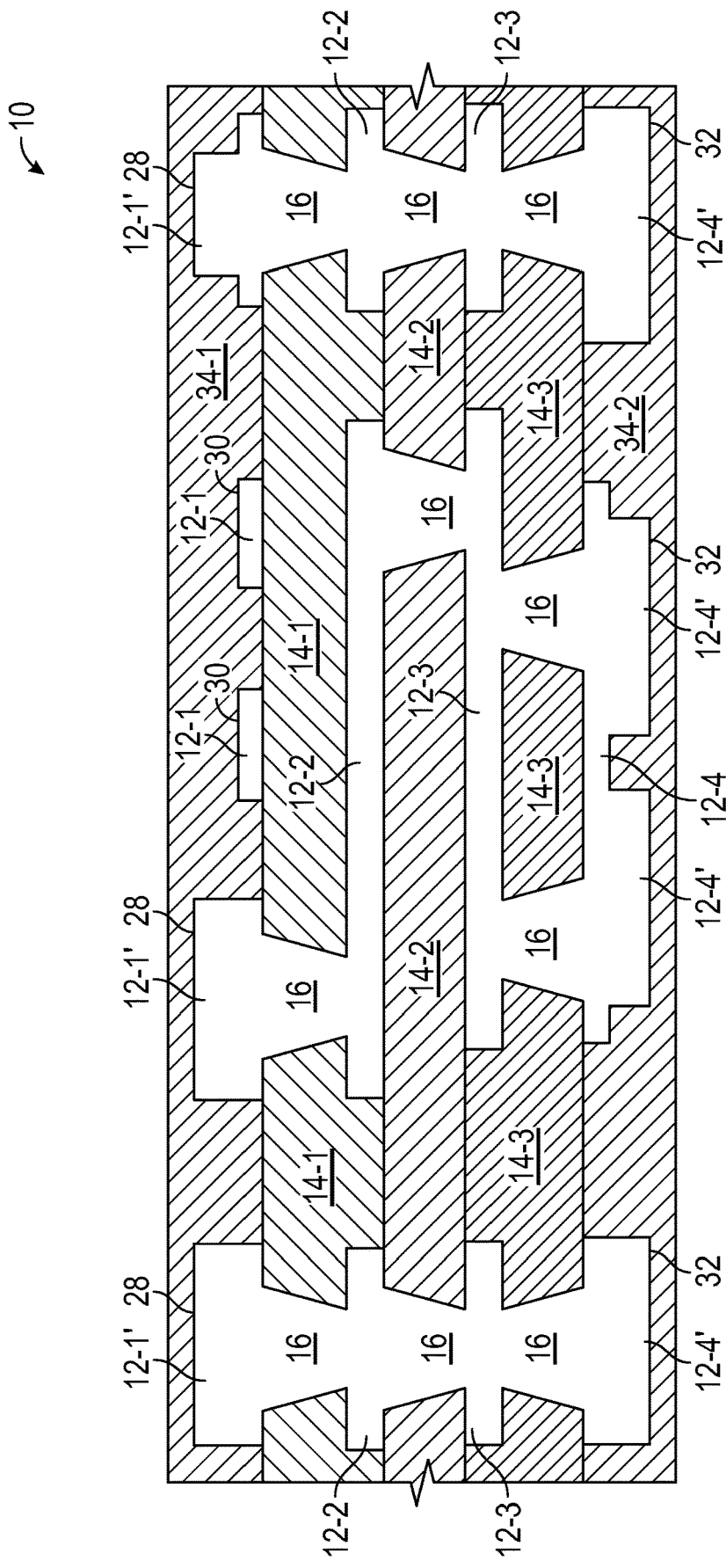
FIG. 5 is a cross-sectional view of the substrate of FIG. 4 after application of dielectric layers that cover opposing top and bottom faces of the substrate.

FIG. 5 is a cross-sectional view of the substrate 10 of FIG. 4 after application of dielectric layers 34-1, 34-2 that cover opposing top and bottom faces of the substrate 10. The dielectric layers 34-1, 34-2 may be deposited, laminated, coated, or otherwise applied to cover the first conductive layer 12-1 and the fourth conductive layer 12-4. In certain embodiments, the dielectric layers 34-1, 34-2 may comprise one or more of prepreg, a resin coated film, and a solder mask. In certain embodiments, one or more of the dielectric layers 34-1, 34-2 are devoid of acrylic-based materials found in conventional solder mask materials. As such, the dielectric layers 34-1, 34-2 may be formed with improved mechanical and electrical properties over conventional solder mask materials, such as lower coefficient of thermal expansion (CTE), higher elastic modulus, lower material loss tangent (Df), improved insertion loss, and higher glass transition temperature (Tg), among others.

Figure 6:
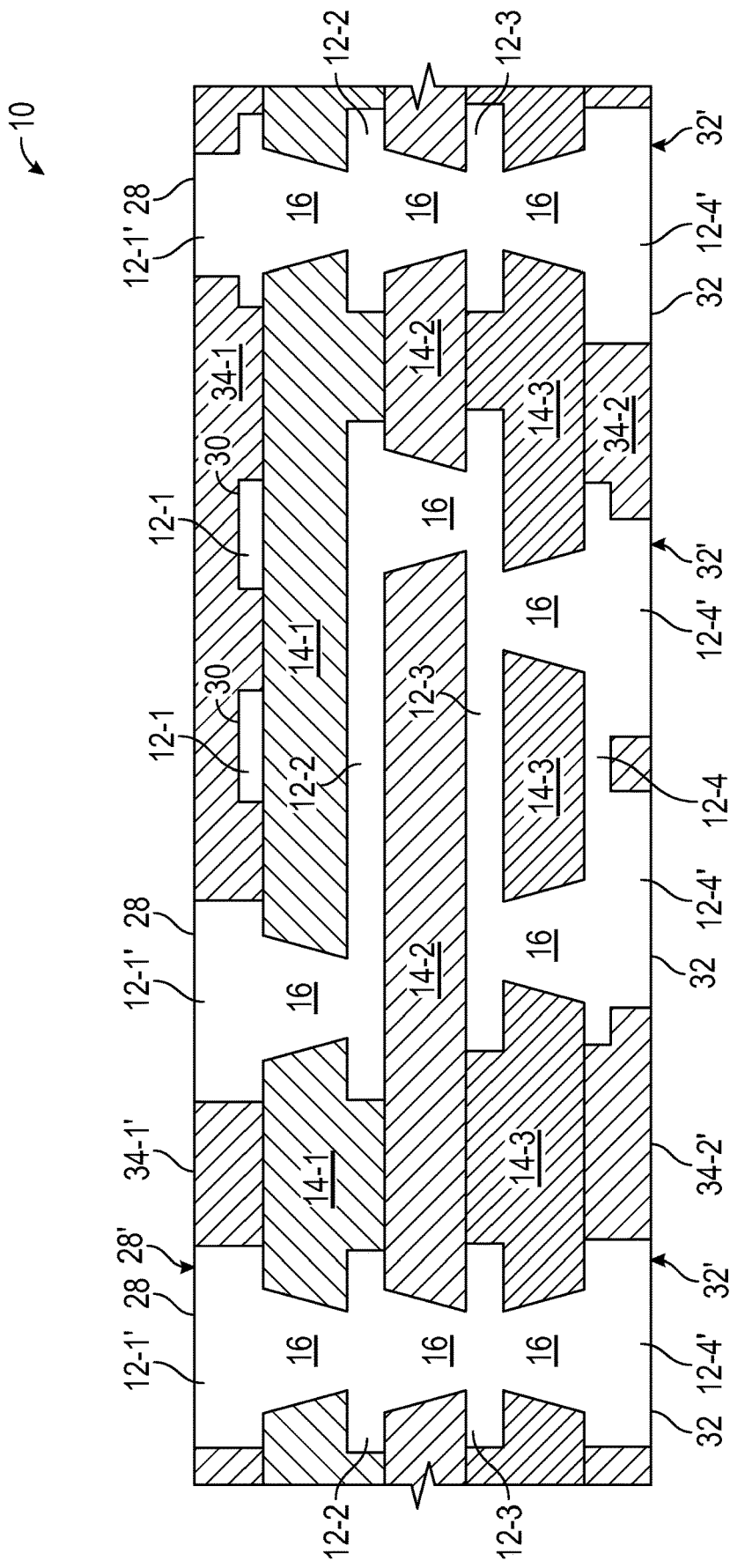
FIG. 6 is a cross-sectional view of the substrate of FIG. 5 after removal of surface portions of the dielectric layers.

FIG. 6 is a cross-sectional view of the substrate 10 of FIG. 5 after removal of surface portions of the dielectric layers 34-1, 34-2 of FIG. 5. In this manner, thicknesses of the dielectric layers 34-1, 34-2 are reduced compared with FIG. 5. Surface removal of portions of the dielectric layers 34-1, 34-2 may comprise planarizing top and/or bottom surfaces of the dielectric layers 34-1, 34-2. In certain embodiments, such steps may comprise one or more of mechanical grinding and plasma etching to form the dielectric layers 34-1, 34-2 with reduced thicknesses. Surface removal may occur until top surfaces 28' of one or more of the contact pads 28 are accessible or exposed through the dielectric layer 34-1 and bottom surfaces 32' of one or more of the mounting pads 32 are exposed through the dielectric layer 34-2. Notably, the top surfaces 28' of one or more of the contact pads 28 may be coplanar with a top surface 34-1' of the dielectric layer 34-1 while at least portions of the metal traces 30 may be completely embedded within the dielectric layer 34-1.

Depending on manufacturing tolerances, minor deviations in height between the top surfaces 28' and the top surfaces 34-1' may exist such that the respective heights are within plus or minus 1% of one another while still providing a flat or planar top surface. In this regard, the substrate 10 may be formed with a generally flat or planar top surface that provides numerous advantages for subsequent device assembly steps. For example, solder paste may be screened across the substrate 10 for soldering electronic die or components to the contact pads 28. Underfill materials that may be provided to fill any gaps between electronic die or components and the substrate 10 may have easier and more direct wicking paths. In certain applications, deposition of electromagnetic shielding layers by plating or sputtering may be improved with planar surfaces of the substrate 10. Certain devices that may be attached to the substrate 10 may use pin contacts for electrical testing. As such, electrical testing probes may move easier above the flat surface of the substrate 10 with reduced substrate damage. Additionally, post assembly cleaning steps may be improved.

In a similar manner, the bottom surfaces 32' of one or more of the mounting pads 32 may be coplanar with a bottom surface 34-2' of the dielectric layer 34-2. In this regard, the substrate 10 may be formed with a generally flat or planar bottom surface for improved mounting and thermal contact with another surface. Additionally the increased thickness portions 12-1' of the first conductive layer 12-1 and the increased thickness portions 12-4' of the fourth conductive layer 12-4 may provide additional improved thermal spreading or dissipation of heat that may be generated by electronic die and/or components that are mounted on the substrate 10. In certain embodiments, at least one of the mounting pads 32 comprises a portion that is covered by the second dielectric layer 34-2. In this manner, larger continuous portions of the fourth conductive layer 12-4 (e.g., ground planes and/or heat sinks) may be configured with discontinuous exposed surfaces for improved mounting or soldering to another surface.

Figure 7:
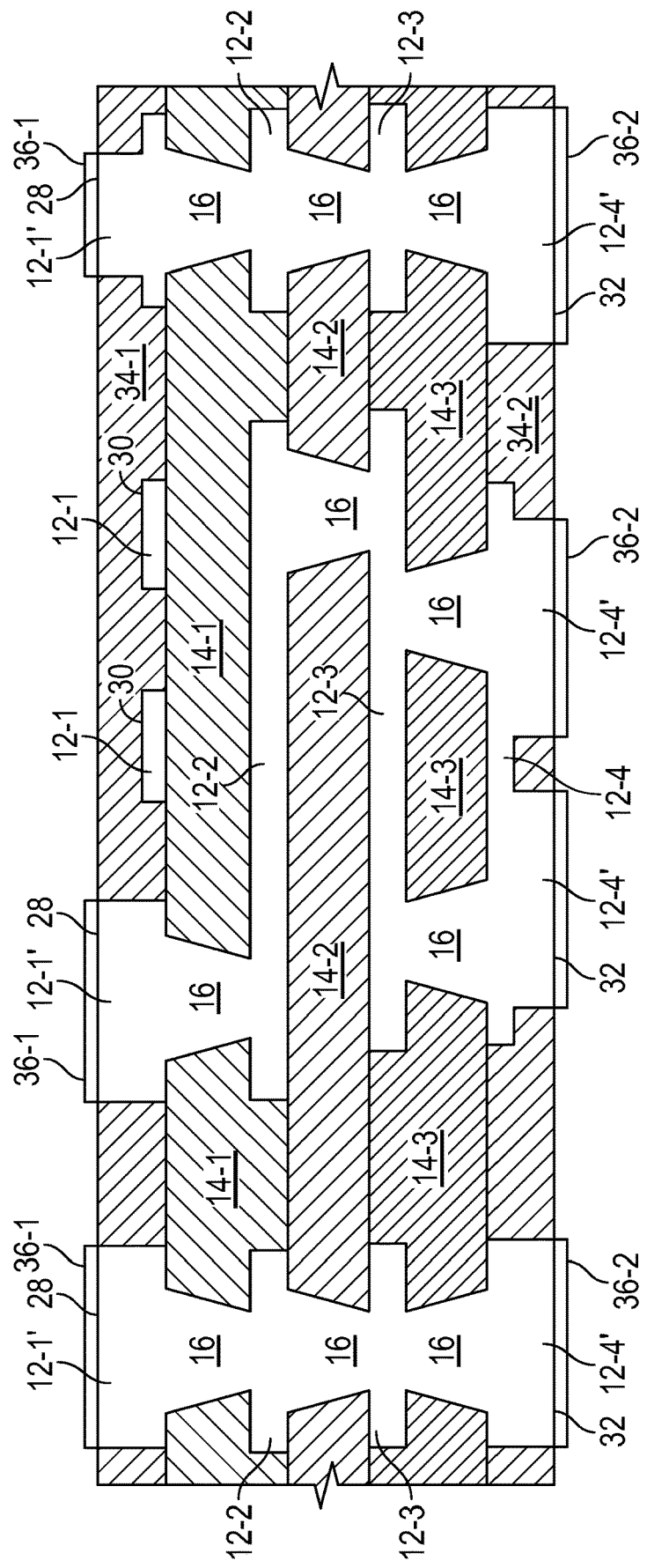
FIG. 7 is a cross-sectional view of the substrate of FIG. 6 after application of surface finish coatings to contact pads and mounting pads.

FIG. 7 is a cross-sectional view of the substrate 10 of FIG. 6 after application of surface finish coatings 36-1, 36-2 to the contact pads 28 and the mounting pads 32, respectively. The surface finish coatings 36-1, 36-2 may be provided for environmental protection of exposed portions of the contact pads 28 and the mounting pads 32. In certain embodiments, the surface finish coating 36-1 may comprise an organic solderability preservative (OSP) that selectively bonds to the contact pads 28 for oxidation prevention until soldering. The surface finish coating 36-2 may comprise electroless nickel electroless palladium immersion gold (ENEPIG) to improve solderability and reliability of the mounting pads 32. While OSP and ENEPIG are provided as examples, other surface finish coatings may be also be used.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An electronic substrate comprising:
a non-conductive layer;
a conductive layer on the non-conductive layer, the conductive layer forming at least one contact pad and at least one metal trace;
a dielectric layer on the conductive layer such that the at least one metal trace is covered by the dielectric layer and a top surface of the at least one contact pad is coplanar with a top surface of the dielectric layer; and
an additional conductive layer that forms at least one mounting pad, wherein a bottom surface of the at least one mounting pad is coplanar with a bottommost face of the electronic substrate.

2. The electronic substrate of claim 1, wherein the conductive layer comprises copper.

3. The electronic substrate of claim 1, wherein the dielectric layer comprises prepreg or a resin coated film.

4. The electronic substrate of claim 1, wherein the dielectric layer is devoid of acrylic-based materials.

5. The electronic substrate of claim 1, wherein a thickness of the at least one contact pad above the non-conductive layer is in a range including 3 microns (µm) to 12 µm greater than a thickness of the at least one metal trace above the non-conductive layer.

6. The electronic substrate of claim 1, wherein at least a portion of the at least one metal trace is completely embedded in the dielectric layer.

7. The electronic substrate of claim 1, wherein the non-conductive layer and the conductive layer form a laminate structure with a plurality of additional non-conductive layers and a plurality of additional conductive layers.

8. The electronic substrate of claim 1, further comprising an additional dielectric layer and wherein the bottom surface of the at least one mounting pad is coplanar with a bottom surface of the additional dielectric layer.

9. The electronic substrate of claim 8, further comprising a surface finish coating on the at least one contact pad and the at least one mounting pad.

10. The electronic substrate of claim 8, wherein the at least one mounting pad comprises a portion that is covered by the additional dielectric layer.

11. An electronic substrate comprising:
a non-conductive layer;
a conductive layer on the non-conductive layer, the conductive layer forming at least one contact pad and at least one metal trace, wherein a thickness of the at least one contact pad is greater than a thickness of the at least one metal trace above the non-conductive layer;
a dielectric layer on the conductive layer such that the at least one metal trace is covered by the dielectric layer and a top surface of the at least one contact pad is uncovered by the dielectric layer; and
an additional conductive layer, wherein a portion of the additional conducive layer forms at least one mounting pad at a bottom face of the electronic substrate, and a thickness of the at least one mounting pad is greater than a thickness of at least one other portion of the additional conductive layer.

12. The electronic substrate of claim 11, wherein the thickness of the at least one contact pad is in a range including 3 microns (µm) to 12 µm greater than the thickness of the at least one metal trace above the non-conductive layer.

13. The electronic substrate of claim 11, wherein at least a portion of the at least one metal trace is completely embedded in the dielectric layer.

14. The electronic substrate of claim 11, wherein the thickness of the at least one contact pad is within one percent of a thickness of the dielectric layer above the non-conductive layer.

15. The electronic substrate of claim 11, wherein the at least one contact pad and the at least one metal trace comprise the same material.

16. The electronic substrate of claim 11, wherein the at least one mounting pad comprises two mounting pads that are connected to one another by the at least one other portion of the additional conducive layer.

* * * * *